(12) United States Patent
Dasika et al.

(10) Patent No.: US 11,868,778 B2
(45) Date of Patent: Jan. 9, 2024

(54) COMPACTED ADDRESSING FOR TRANSACTION LAYER PACKETS

(71) Applicant: ADVANCED MICRO DEVICES, INC., Santa Clara, CA (US)

(72) Inventors: Ganesh Dasika, Austin, TX (US); Sergey Blagodurov, Bellevue, WA (US); Seyedmohammad Seyedzadehdelcheh, Bellevue, WA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 432 days.

(21) Appl. No.: 16/937,189

(22) Filed: Jul. 23, 2020

(65) Prior Publication Data

US 2022/0027158 A1 Jan. 27, 2022

(51) Int. Cl.
G06F 9/34 (2018.01)
G06F 9/30 (2018.01)
G06F 13/16 (2006.01)

(52) U.S. Cl.
CPC .......... G06F 9/342 (2013.01); G06F 9/30036 (2013.01); G06F 9/30101 (2013.01); G06F 9/30167 (2013.01); G06F 13/1657 (2013.01)

(58) Field of Classification Search
None
See application file for complete search history.

(56) References Cited

U.S. PATENT DOCUMENTS

| | | | |
|---|---|---|---|
| 6,285,686 B1 | 9/2001 | Sharma | |
| 2005/0182841 A1 | 8/2005 | Sharp | |
| 2007/0147426 A1* | 6/2007 | Sharma | G06F 13/4221 370/469 |
| 2007/0299997 A1 | 12/2007 | Yasui | |
| 2019/0045030 A1 | 2/2019 | Kounavis et al. | |

OTHER PUBLICATIONS

International Search Report and Written Opinion, PCT/US2021/036103, dated Oct. 6, 2021, 13 pages.

Chen et al., "C-pack: A High-Performance Microprocessor Cache Compression Algorithm," https://doi.org/10.1109/TVLSI.2009.2020989, IEEE Transactions on Very Large Scale Integration (VLSI) Systems, vol. 18, Issue 8, Aug. 2010, 11 pages.

El-Fiky et al., "400 Gb/s O-Band Silicon Photonic Transmitter for Intra-Datacenter Optical Interconnects," Optics Express 10258, vol. 27, No. 7, Apr. 1, 2019, 11 pages.

(Continued)

*Primary Examiner* — Yaima Rigol

(57) ABSTRACT

Compacted addressing for transaction layer packets, including: determining, for a first epoch, one or more low entropy address bits in a plurality of first transaction layer packets; removing, from one or more memory addresses of one or more second transaction layer packets, the one or more low entropy address bits; and sending the one or more second transaction layer packets.

20 Claims, 7 Drawing Sheets

(56) References Cited

OTHER PUBLICATIONS

G. Pekhimenko et al., "Base-Delta-Immediate Compression: Practical Data Compression for On-Chip Caches," PACT 12: Proceedings of the 21st International Conference on Parallel Architectures and Compilation Techniques, Sep. 19-23, 2012, Minneapolis, Minnesota, USA, https://doi.org/10.1145/2370816.2370870, ACM 978-1-4503-1182-3/12/09, pp. 377-388.

Goldhammer et al., "Understanding Performance of PCI Express Systems," Xilinx, WP350 (v1.1), Sep. 4, 2008, 18 pages.

Intel Corporation, AN 835: PAM4 Signaling Fundamentals, https://www.intel.com/content/dam/www/programmable/us/en/pdfs/literature/an/an835.pdf, Initial Release Jan. 31, 2018, Document Revision Mar. 12, 2019, pp. 1-52.

J. Kim et al., "Frugal ECC: Efficient and Versatile Memory Error Protection Through Fine-Grained Compression," http://dx.doi.org/10.1145/2807591.2807659, SC15: The International Conference for High Performance Computing, Networking, Storage and Analysis, Nov. 15-20, 2015, Austin, TX, USA, ISBN 978-1-4503-3723-6, 12 pages.

Lin et al., "A Brief Tour of FEC for Serial Link Systems", DesignCon, Jan. 2015, Santa Clara, CA, USA, 54 pages.

Seyedzadeh et al., "Enabling Fine-Grain Restricted Coset Coding Through Word-Level Compression for PCM," https://www.semion.io/doc/enabling-fine-grain-restricted-coset-coding-through-word-level-compression-for-pcm, 24th IEEE International Symposium on High-Performance Computer Architecture, Feb. 24-28, 2018, Vienna, Austria, HPCA 2018, 12 pages.

\* cited by examiner

COMPACTED ADDRESSING FOR TRANSACTION LAYER PACKETS

BACKGROUND

Improvements in interconnects for transaction layer packets increase bandwidth at the expense of weaker signal integrity. Though error correction codes or other data increases signal integrity, it imposes significant encoding overhead, thereby degrading system performance.

DETAILED DESCRIPTION

Figure 1:
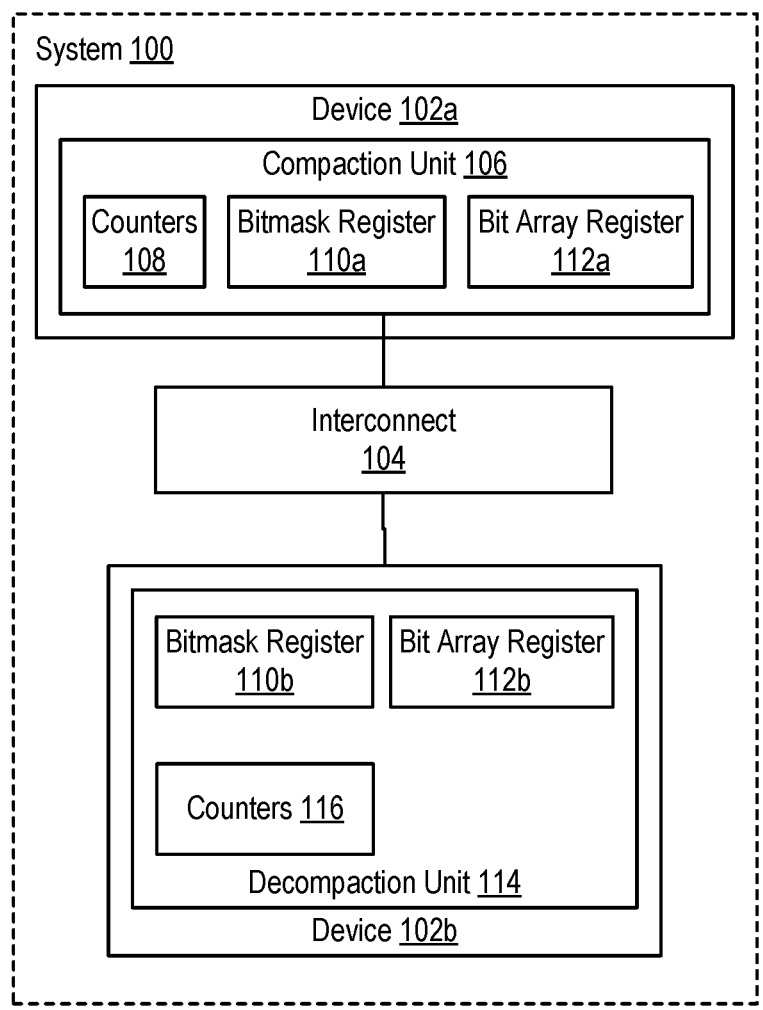
FIG. 1 is a block diagram of an example processor for compacted addressing for transaction layer packets according to some embodiments.

In some embodiments, a method of method of compacted addressing for transaction layer packets includes: determining, for a first epoch, one or more low entropy address bits in a plurality of first transaction layer packets; removing, from one or more memory addresses of one or more second transaction layer packets, the one or more low entropy address bits; and sending the one or more second transaction layer packets.

In some embodiments, determining, within the first epoch, the one or more low entropy address bits in the plurality of first transaction layer packets includes: maintaining, for each address bit in the plurality of first transaction layer packets, a corresponding at least one counter; modifying, the corresponding at least one counter based on a bit value for each address bit in the plurality of first transaction layer packets; and determining, based on the corresponding at least one counter for each address bit in the plurality of first transaction layer packets, the one or more low entropy address bit. In some embodiments, the method further comprises: storing, in a first bitmask register, a bitmask indicating the one or more low entropy address bits; and storing, in a first bit array register, one or more predicted values for the one or more low entropy bits. In some embodiments, the method further includes synchronizing the first bitmask register and the first bit array register with a second bitmask register and a second bit array register of a recipient of the one or more second transaction layer packets. In some embodiments, the method further includes regenerating, based on one or more compacted memory addresses in the one or more second transaction layer packets and one or more stored values indicating the one or more removed low entropy bits, the one or more memory addresses. In some embodiments, the one or more stored values include a second bitmask register storing a bitmask indicating the one or more low entropy bits and a second bit array register storing one or more values for the one or more low entropy bits. In some embodiments, the method further includes sending, to a recipient of the one or more second transaction layer packets, a signal indicating that the one or more second transaction layer packets include one or more compacted destination addresses.

In some embodiments, an apparatus for compacted addressing for transaction layer packets performs steps including: determining, for a first epoch, one or more low entropy address bits in a plurality of first transaction layer packets; removing, from one or more memory addresses of one or more second transaction layer packets, the one or more low entropy address bits; and sending the one or more second transaction layer packets.

In some embodiments, determining, within the first epoch, the one or more low entropy address bits in the plurality of first transaction layer packets includes: maintaining, for each address bit in the plurality of first transaction layer packets, a corresponding at least one counter; modifying, the corresponding at least one counter based on a bit value for each address bit in the plurality of first transaction layer packets; and determining, based on the corresponding at least one counter for each address bit in the plurality of first transaction layer packets, the one or more low entropy address bit. In some embodiments, the steps further include: storing, in a first bitmask register, a bitmask indicating the one or more low entropy address bits; and storing, in a first bit array register, one or more predicted values for the one or more low entropy bits. In some embodiments, the steps further include synchronizing the first bitmask register and the first bit array register with a second bitmask register and a second bit array register of a recipient of the one or more second transaction layer packets. In some embodiments, the steps further include regenerating, based on one or more compacted memory addresses in the one or more second transaction layer packets and one or more stored values indicating the one or more removed low entropy bits, the one or more memory addresses. In some embodiments, the one or more stored values include a second bitmask register storing a bitmask indicating the one or more low entropy bits and a second bit array register storing one or more values for the one or more low entropy bits. In some embodiments, the steps further include sending, to a recipient of the one or more second transaction layer packets, a signal indicating that the one or more second transaction layer packets include one or more compacted destination addresses.

In some embodiments, a system for compacted addressing for transaction layer packets includes an apparatus that performs steps including: determining, for a first epoch, one or more low entropy address bits in a plurality of first transaction layer packets; removing, from one or more memory addresses of one or more second transaction layer packets, the one or more low entropy address bits; and sending the one or more second transaction layer packets.

In some embodiments, determining, within the first epoch, the one or more low entropy address bits in the plurality of first transaction layer packets includes: maintaining, for each address bit in the plurality of first transaction layer packets, a corresponding at least one counter; modifying, the corresponding at least one counter based on a bit value for each address bit in the plurality of first transaction layer packets; and determining, based on the corresponding at least one counter for each address bit in the plurality of first transaction layer packets, the one or more low entropy address bit. In some embodiments, the steps further include: storing, in a first bitmask register, a bitmask indicating the one or more low entropy address bits; and storing, in a first bit array register, one or more predicted values for the one or more low entropy bits. In some embodiments, the steps further include synchronizing the first bitmask register and the first bit array register with a second bitmask register and a second bit array register of a recipient of the one or more second transaction layer packets. In some embodiments, the steps further include regenerating, based on one or more compacted memory addresses in the one or more second transaction layer packets and one or more stored values indicating the one or more removed low entropy bits, the one or more memory addresses. In some embodiments, the one or more stored values include a second bitmask register storing a bitmask indicating the one or more low entropy bits and a second bit array register storing one or more values for the one or more low entropy bits. In some embodiments, the steps further include sending, to a recipient of the one or more second transaction layer packets, a signal indicating that the one or more second transaction layer packets include one or more compacted destination addresses.

FIG. 1 is a block diagram of a non-limiting example system 100. The example system 100 can be implemented in a variety of computing devices, including mobile devices, personal computers, peripheral hardware components, gaming devices, set-top boxes, and the like. The processor 100 includes devices 102a and 102b. The devices 102a/b include hardware devices or components (e.g., of a computing system) communicatively coupled via an interconnect 104. For example, in some embodiments, the devices 102a/b include central processing units (CPUs), graphics processing units (GPUs), memory modules, etc. In some embodiments, the interconnect 104 includes a Peripheral Component Interface (PCI) interconnect.

The devices 102a/b communicate via the interconnect 104 using transaction layer packets (TLPs). For example, a device 102a performs a memory access command on a device 102b by sending one or more transaction layer packets to the device 102b. Each transaction layer packet includes a memory address in the header. The memory address is a target address for the memory access command (e.g., a read command, a write command).

In some embodiments, the memory addresses indicated in the transaction layer packets will have one or more low entropy bits. In other words, within a given time window or epoch, the bits at one or more indices for each transaction layer packet received and/or sent will have a low degree of entropy (e.g., the bits at these indices have a low degree of variance across the transaction layer packets in the epoch. To reduce the number of bits required to express a memory address in a transaction layer packet, the memory addresses may be "compacted" to remove the low entropy bits prior to sending the transaction layer packets to their recipient. These removed or "reclaimed" bits are then available for other use. For example, error correction codes or other data used to ensure data integrity can be added using these reclaimed bits, thereby improving the integrity of communications via the interconnect without increasing the overall size of the transaction layer packets.

A compaction unit 106 of the device 102a determines, within a first epoch, one or more low entropy bits in a plurality of first transaction layer packets. The plurality of first transaction layer packets are transaction layer packets received by the device 102a or generated by the device 102a for communication to the device 102b. The first epoch is a time window during which the first transaction layer packets are received, generated, or set to be sent to the device 102b. The first epoch, and other epochs described herein, comprise a predefined or configurable time duration or interval.

In some embodiments, determining, within a first epoch, one or more low entropy bits in a plurality of first transaction layer packets includes maintaining, for each address bit in the plurality of first transaction layer packets, a corresponding at least one counter 108. In some embodiments, for n-bit memory addresses, the compaction unit 106 maintains n counters 108. For each address bit in the memory addresses of the first plurality of transaction layer packets, the compaction unit 106 updates the counter 108 corresponding to the address bit index. For example, where the address bit at a given index is "1," the compaction unit 106 increments the counter 108 corresponding to the given index. Where the address bit at a given index is "0," the compaction unit 106 decrements the counter 108 corresponding to the given index. Thus, for each of the first transaction layer packets, each counter 108 is either incremented or decremented based on the value of the corresponding address bit.

In some embodiments, for n-bit memory addresses, the compaction unit 106 maintains two sets of n counters 108 each. In other words, each address bit in the transaction layer packet corresponds to two counters 108. For each address bit in the memory addresses of the first plurality of transaction layer packets, the compaction unit 106 updates one of the counters 108 corresponding to the address bit index depending on the value of the address bit. For example, where the address bit at a given index is "1," the compaction unit 106 increments a first counter 108 corresponding to the given index. Where the address bit at a given index is "0," the compaction unit 106 increments a second counter 108 corresponding to the given index. Thus, for each of the first transaction layer packets, either a first or second counter 108 is incremented based on the value of the corresponding address bit.

The compaction unit 106 then determines (e.g., at the end of the first epoch) the one or more low entropy address bits based on the counters 108. For example, in some embodiments where each address bit corresponds to a single counter 108 that is incremented or decremented based on the value of the corresponding address bit, a low entropy bit is identified by having a counter 108 with an absolute value above a threshold. That is, low entropy bits will have counters 108 of higher absolute values as the counters 108 will either be frequently incremented or frequently decremented. Conversely, high entropy bits will have counters 108 that are both incremented and decremented to a more similar degree.

As an example, assume that t-bit counters 108 are used and a threshold "T" is defined where $0<=T<=1$. Where a counter 108 value $C_x$ is greater than $T*(2^t-1)$, the corresponding address bit is determined to be a low entropy bit and the bit value is predicted to be "1." Where $C_x$ is less than $(1-T)*(2^t-1)$, the corresponding address bit is determined to be a low entropy bit and the bit value is predicted to be "0." Where $C_x>=(1-T)*(2^t-1)$ and $C_x<=T*(2^t-1)$, the corresponding address bit is determined to be and no value is predicted.

As another example, in some embodiments where each address bit corresponds to two counters 108 that are alternatively incremented based on the value of the corresponding address bit, a low entropy bit is identified by having one counter 108 value significantly greater than the other counter 108 value (e.g., the difference between the first counter 108 value and the second counter 108 exceeds a threshold). Conversely, high entropy bits are identified by having similar values for the first and second counter 108.

In some embodiments, to identify which address bits (e.g., address bit indices) are determined to be low entropy bits, the compaction unit 106 stores a bitmask in a bitmask register 110a. One skilled in the art would appreciate that, in some embodiments, the bitmask is stored in a non-register portion of allocated memory. For example, where an address bit at index i is determined to be a low entropy bit, the value of the bitmask at index i is set to "1." Conversely, where an address bit at index i is determined to be a high entropy bit, the value of the bitmask at index i is set to "0" or remains unmodified. For example, in some embodiments, the compaction unit 106 resets or zeroes out the bitmask register 110a. Accordingly, bitmask indices for high entropy bits need not be modified from their initialized "0" state.

In some embodiments, to identify the predicted values of address bits (e.g., address bit indices) determined to be low entropy bits, the compaction unit 106 stores a corresponding value in a bit array register 112a. One skilled in the art would appreciate that, in some embodiments, the predicted values are stored in a non-register portion of allocated memory. Moreover, although the bit array register 112a is discussed as storing values in an array, one skilled in the art would appreciate that other non-array data structures are capable of being used. For example, where a value for a low entropy address bit at index i is predicted to be "1," the value at a bit array (stored in the bit array register 112a) at index i is set to "1." As another example, where a value for a low entropy address bit at index i is predicted to be "0," the value at a bit array (stored in the bit array register 112a) at index i is set to "0." For high entropy address bits, no value need be set in the bit array register 112a as no value is predicted. In some embodiments, the bit array register 112a is reset (e.g., zeroed out, set to all NULL or default values) at each epoch.

The compaction unit 106 then removes, from one or more memory addresses of one or more second transaction layer packets associated with a second epoch after the first epoch, the one or more low entropy address bits. For example, the bitmask stored in the bit array register 110a is used to determine which indices of the memory address are determined to be low entropy bits. For each index identified as a low entropy bit (e.g., having a bitmask value of "1"), the values of the bit array register 112a at these indices are compared to the corresponding value of a memory address in the second transaction layer packets. If, for each index identified as a low entropy bit, the corresponding bit in the memory address of the second transaction layer packet matches the corresponding value in the bit array register 112a (e.g., if an XOR comparison of each bit at low entropy bit indices for the memory address and the bit array results in a "0"), the low entropy address bits are then removed from the memory address of the second transaction layer packet.

In some embodiments, additional data is encoded in the one or more second transaction layer packets, such as error correction codes or other data integrity data. The device 102a then sends the one or more second transaction layer packets to the device 102b.

In some embodiments, the approaches described above are repeated for each epoch (e.g., at a predefined interval). For example, the compaction unit 106 determines, for the first epoch, low entropy address bits for the plurality of first transaction layer packets. For example, during the first epoch, counters 108 are maintained and updated based on the memory addresses of the plurality of first transaction layer packets. At the end of the first epoch, the low entropy address bits are identified and the bitmask register 110a and bit array registers 112a are updated accordingly. During a second epoch, the low entropy address bits are removed from one or more second transaction layer packets based on the values of the bitmask register 110a and bit array register 112a determined from the plurality of first transaction layer packets. Additionally, the counters 108 are reset and updated based on the memory addresses of the one or more second transaction layer packets. At the end of the second epoch, the bitmask register 110a and bit array registers 112 are updated based on low entropy bits identified from the second transaction layer packets. Matching low entropy bits are then removed from third transaction layer packets for a third epoch, etc.

A decompaction unit 114 of the device 102b regenerates the original, uncompacted memory addresses for received transaction layer packets (e.g., the one or more second transaction layer packets from which the one or more low entropy bits were removed). To facilitate regeneration of memory addresses, in some embodiments, the decompaction unit 114 includes a bitmask register 110b and bit array register 112b synchronized with the bitmask register 110a and bit array register 112a of the compaction unit 106. For example, in some embodiments, after storing values in the bitmask register 110a and/or bit array register 112a, the compaction unit 106 of the device 102a provides a signal indicating the stored value(s) to the decompaction unit 114 of the device 102b. Moreover, in response to removing the one or more low entropy address bits, the compaction unit 106 provides a signal to the decompaction unit 114 of the device 102b indicating that the one or more second transaction layer packets include compacted memory addresses. Thus, the compaction unit 114 determines, based on the received signal, to regenerate the memory addresses of the one or more second transaction layer packets based on the values stored in the bitmask register 110b and bit array register 112b. The decompaction unit 114 may also include one or more counters 116 to synchronize the bitmask registers 110a/b and bit array registers 112a/b.

Although the example system 100 depicts two devices 102a/b, it is understood that the approaches described herein may be implemented in systems with any number of interconnected devices. Moreover, although the example system 100 shows the device 102a as having a compaction unit 106 and the device 102b as having a decompaction unit 114, it is understood that in some embodiments devices may include both compaction units 106 and decompaction units 114 to facilitate bidirectional transmission of transaction layer packets with compacted memory addresses.

Figure 2:
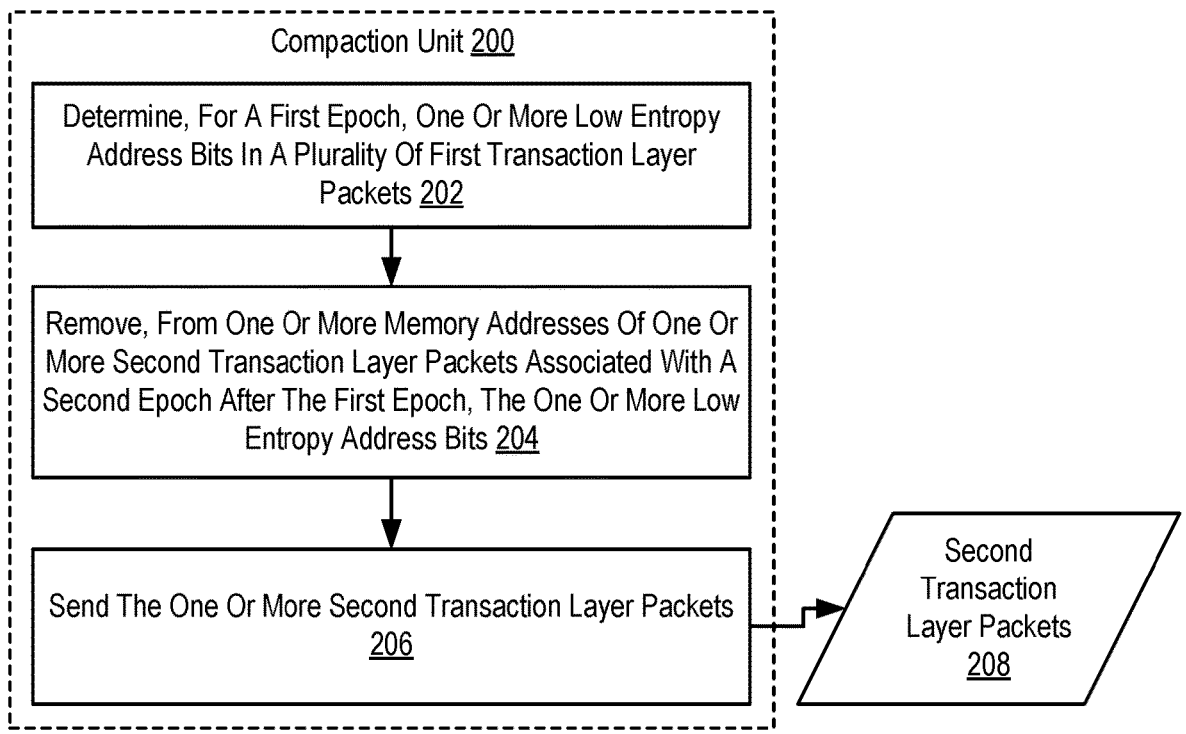
FIG. 2 is a flowchart of an example method for compacted addressing for transaction layer packets according to some embodiments.

For further explanation, FIG. 2 sets forth a flow chart illustrating an exemplary method for compacted addressing for transaction layer packets that includes determining 202 (e.g., by a compaction unit 200), for a first epoch, one or more low entropy address bits in a plurality of first transaction layer packets. Each transaction layer packet in the plurality of first transaction layer packets includes a memory address in the header. The memory address is a target address for the memory access command (e.g., a read command, a write command). The one or more low entropy address bits are the indices of bits in the memory address that have a low degree of entropy across each of the plurality of first transaction layer packets.

The plurality of first transaction layer packets are transaction layer packets received by a device 102a associated with the compaction unit 200 or generated by the device 102*a* associated with the compaction unit 200 for communication to the device 102*b*. The first epoch is a time window during which the first transaction layer packets are received, generated, or set to be sent to the device 102*b*. The first epoch, and other epochs described herein, comprise a predefined or configurable time duration or interval.

In some embodiments, determining 202 one or more low entropy address bits includes storing an indication of which bits (e.g., which bit indices) correspond to low address bits. For example, a bitmask is stored in a bitmask register 110*a* or other allocated portion of memory. Each index of the bitmask corresponding to a low entropy bit index is set to a predefined value (e.g., "1"). In some embodiment, determining 202 one or more low entropy address bits includes predicting values for the one or more low entropy address bits and storing an indication of the predicted values. For example, in some embodiments, a bit array or other data structure is stored in a bit array register 112*a* or other allocated portion of memory. Each entry in the bit array corresponding to a low entropy address bit is set to a predicted value for that low entropy address bit (e.g., "0" or "1").

The method of FIG. 2 also includes removing 204, from one or more memory addresses of one or more second transaction layer packets 208 associated with a second epoch after the first epoch, the one or more low entropy address bits. For example, the bitmask stored in the bit array register 110*a* is used to determine which indices of the memory address are determined to be low entropy bits. For each index identified as a low entropy bit (e.g., having a bitmask value of "1"), the values of the bit array register 112*a* at these indices are compared to the corresponding value of a memory address in the second transaction layer packets 208. If, for each index identified as a low entropy bit, the corresponding bit in the memory address of the second transaction layer packet matches the corresponding value in the bit array register 112*a*, the low entropy address bits are then removed from the memory address of the second transaction layer packet.

In some embodiments, additional data is encoded in the one or more second transaction layer packets 208, such as error correction codes or other data integrity data. The method of FIG. 2 also includes sending 206 the one or more second transaction layer packets 208. For example, the one or more second transaction layer packets 208 are sent to the device 102*b* via an interface 104.

Figure 3:
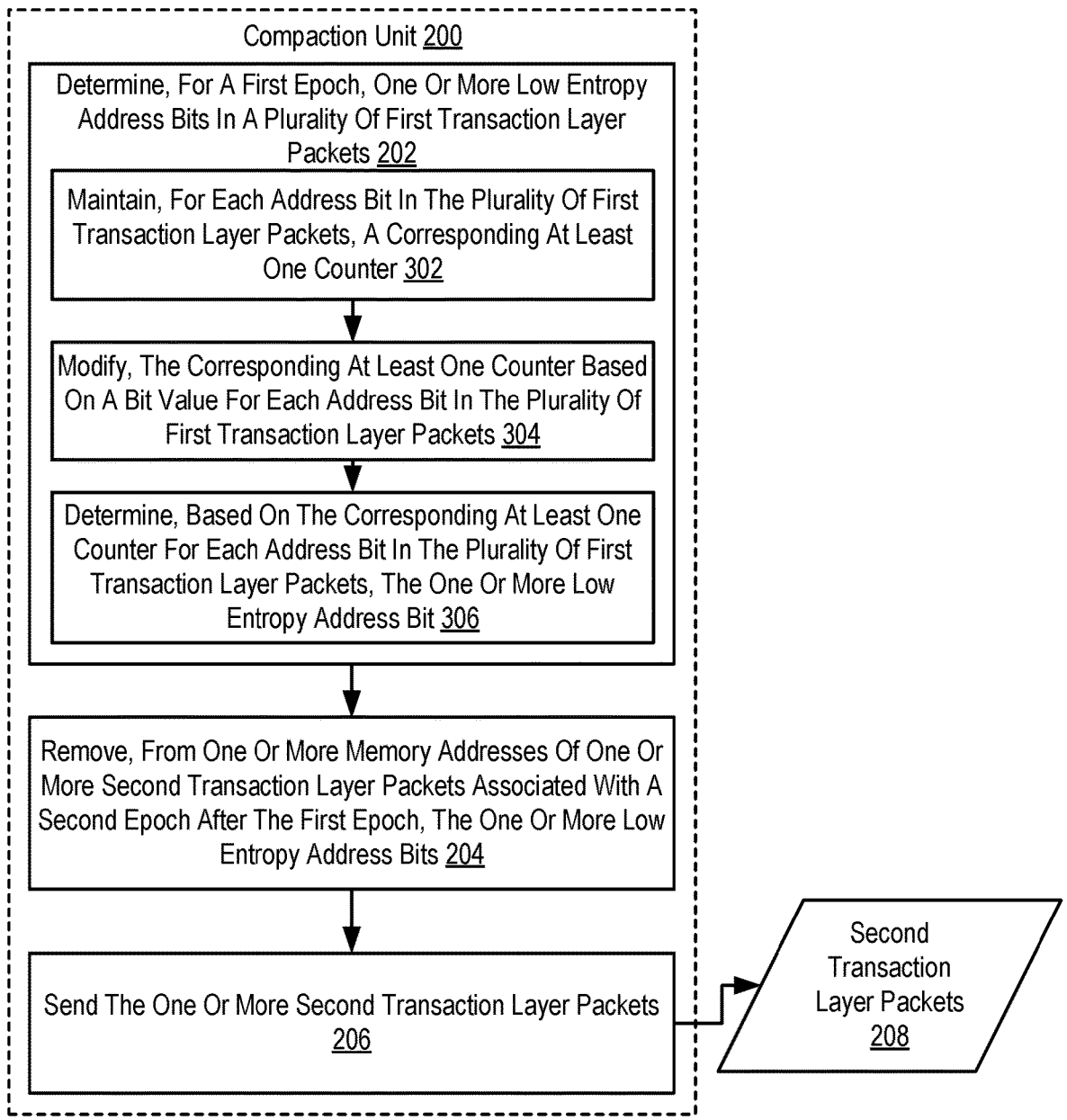
FIG. 3 is a flowchart of an example method for compacted addressing for transaction layer packets according to some embodiments.

For further explanation, FIG. 3 sets forth a flow chart illustrating an exemplary method for compacted addressing for transaction layer packets that includes determining 202 (e.g., by a compaction unit 200), for a first epoch, one or more low entropy address bits in a plurality of first transaction layer packets; removing 204, from one or more memory addresses of one or more second transaction layer packets 208 associated with a second epoch after the first epoch, the one or more low entropy address bits; and sending 206 the one or more second transaction layer packets 208.

The method of FIG. 3 differs from FIG. 2 in that determining 202 (e.g., by a compaction unit 200), for a first epoch, one or more low entropy address bits in a plurality of first transaction layer packets includes maintaining 302, for each address bit in the plurality of first transaction layer packets, a corresponding at least one counter 108. In some embodiments, for n-bit memory addresses, the compaction unit 200 maintains n counters 108. In other embodiments, for n-bit memory addresses, the compaction unit 200 maintains two sets of n counters 108 each. In other words, each address bit in the transaction layer packet corresponds to two counters 108.

The method of FIG. 3 also includes modifying 304 the corresponding at least one counter based on a bit value for each address bit in the plurality of first transaction layer packets. Where the compaction unit 200 maintains n counters 108 for an n-bit memory address, for each address bit in the memory addresses of the first plurality of transaction layer packets, the compaction unit 200 updates the counter 108 corresponding to the address bit index. For example, where the address bit at a given index is "1," the compaction unit 200 increments the counter 108 corresponding to the given index. Where the address bit at a given index is "0," the compaction unit 200 decrements the counter 108 corresponding to the given index. Thus, for each of the first transaction layer packets, each counter 108 is either incremented or decremented based on the value of the corresponding address bit.

Where the compaction unit 200 maintains 2*n counters 108 for an n-bit memory address, for each address bit in the memory addresses of the first plurality of transaction layer packets, the compaction unit 200 updates one of the counters 108 corresponding to the address bit index depending on the value of the address bit. For example, where the address bit at a given index is "1," the compaction unit 200 increments a first counter 108 corresponding to the given index. Where the address bit at a given index is "0," the compaction unit 200 increments a second counter 108 corresponding to the given index. Thus, for each of the first transaction layer packets, either a first or second counter 108 is incremented or based on the value of the corresponding address bit.

The method of FIG. 3 also includes determining 306 (e.g., at the end of the first epoch) the one or more low entropy address bits based on the counters 108. For example, in some embodiments where each address bit corresponds to a single counter 108 that is incremented or decremented based on the value of the corresponding address bit, a low entropy bit is identified by having a counter 108 with an absolute value above a threshold. That is, low entropy bits will have counters 108 of higher absolute values as the counters 108 will either be frequently incremented or frequently decremented. Conversely, high entropy bits will have counters 108 that are both incremented and decremented to a more similar degree.

As an example, assume that t-bit counters 108 are used and a threshold "T" is defined where $0<=T<=1$. Where a counter 108 value $C_x$ is greater than $T*(2^t-1)$, the corresponding address bit is determined to be a low entropy bit and the bit value is predicted to be "1." Where $C_x$ is less than $(1-T)*(2^t-1)$, the corresponding address bit is determined to be a low entropy bit and the bit value is predicted to be "0." Where $C_x>=(1-T)*(2^t-1)$ and $C_x<=T*(2^t-1)$, the corresponding address bit is determined to be and no value is predicted.

As another example, in some embodiments where each address bit corresponds to two counters 108 that are alternatively incremented based on the value of the corresponding address bit, a low entropy bit is identified by having one counter 108 value significantly greater than the other counter 108 value (e.g., the difference between the first counter 108 value and the second counter 108 exceeds a threshold). Conversely, high entropy bits are identified by having similar values for the first and second counter 108.

Figure 4:
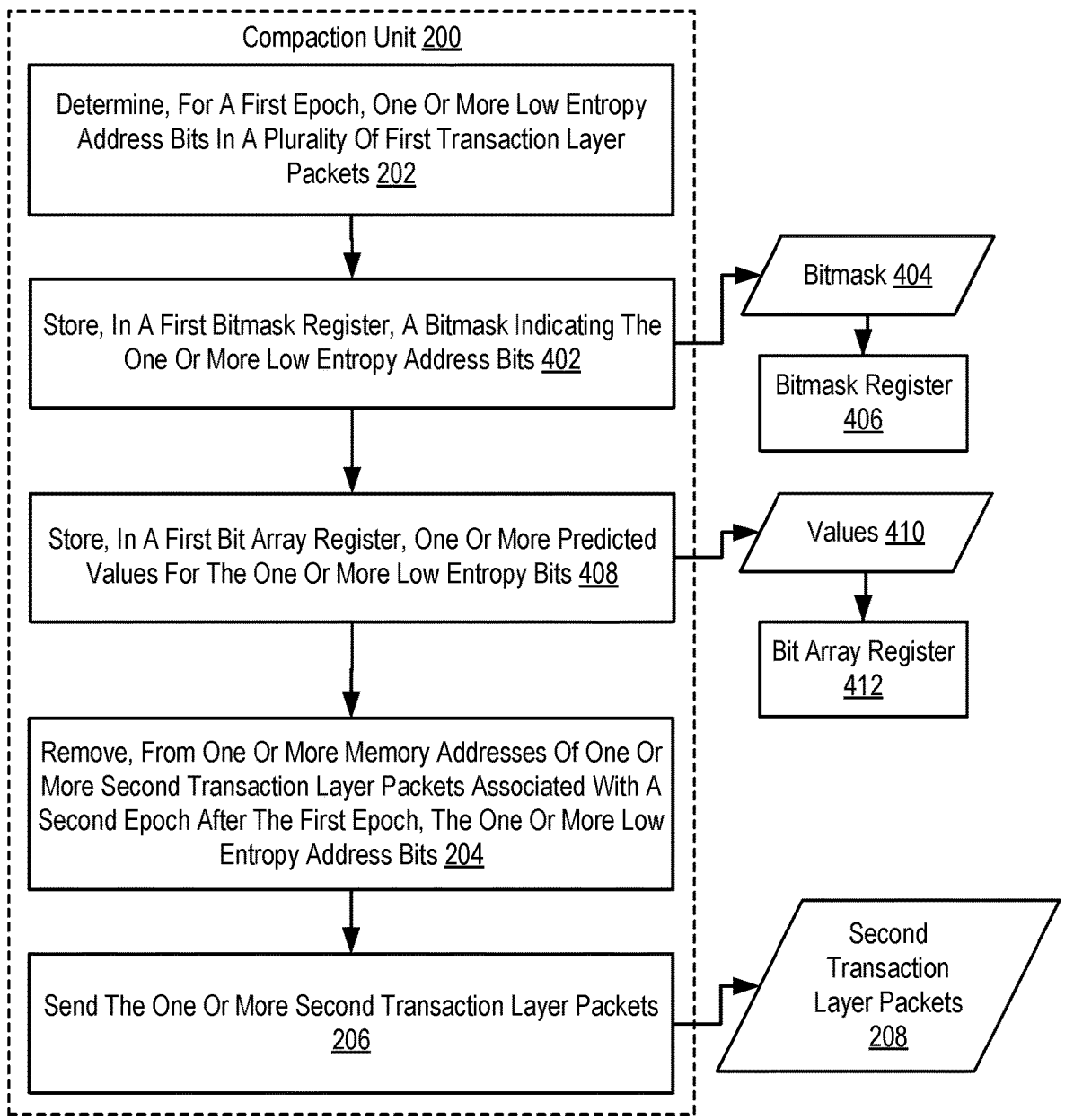
FIG. 4 is a flowchart of an example method for compacted addressing for transaction layer packets according to some embodiments.

For further explanation, FIG. 4 sets forth a flow chart illustrating an exemplary method for compacted addressing for transaction layer packets that includes determining 202

(e.g., by a compaction unit 200), for a first epoch, one or more low entropy address bits in a plurality of first transaction layer packets; removing 204, from one or more memory addresses of one or more second transaction layer packets 208 associated with a second epoch after the first epoch, the one or more low entropy address bits; and sending 206 the one or more second transaction layer packets 208.

The method of FIG. 4 differs from FIG. 2 in that the method of FIG. 4 also includes storing 402, in a first bitmask register 406, a bitmask 404 indicating the one or more low entropy address bits. For example, where an address bit at index i is determined to be a low entropy bit, the value of the bitmask 404 at index i is set to "1." Conversely, where an address bit at index i is determined to be a high entropy bit, the value of the bitmask 404 at index i is set to "0" or remains unmodified. For example, in some embodiments, the compaction unit 200 resets or zeroes out the bitmask register 406 (e.g., for each epoch). Accordingly, bitmask 404 indices for high entropy bits need not be modified from their initialized "0" state.

FIG. 4 also includes storing 408, in a first bit array register 412, one or more predicted values 410 for the one or more low entropy bits. For example, where a value for a low entropy address bit at index i is predicted to be "1," the value at a bit array (stored in the bit array register 412) at index i is set to "1." As another example, where a value for a low entropy address bit at index i is predicted to be "0," the value at a bit array (stored in the bit array register 412) at index i is set to "0." For high entropy address bits, no value need be set in the bit array register 412 as no value is predicted. In some embodiments, the bit array register 412 is reset (e.g., zeroed out, set to all NULL or default values) at each epoch.

Figure 5:
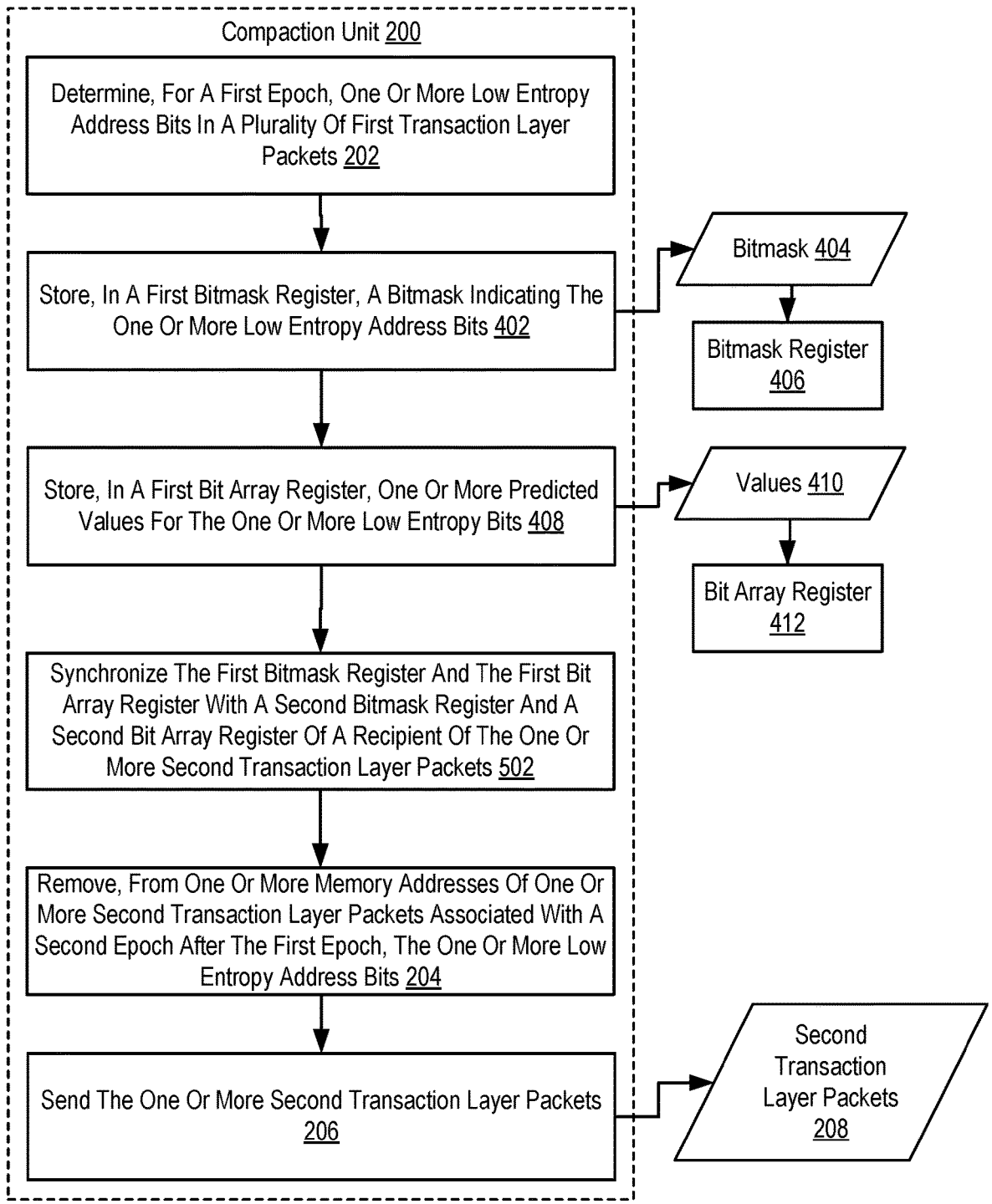
FIG. 5 is a flowchart of an example method for compacted addressing for transaction layer packets according to some embodiments.

For further explanation, FIG. 5 sets forth a flow chart illustrating an exemplary method for compacted addressing for transaction layer packets that includes determining 202 (e.g., by a compaction unit 200), for a first epoch, one or more low entropy address bits in a plurality of first transaction layer packets; storing 402, in a first bitmask register 406, a bitmask 404 indicating the one or more low entropy address bits; 408, in a first bit array register 412, one or more predicted values 410 for the one or more low entropy bits; removing 204, from one or more memory addresses of one or more second transaction layer packets 208 associated with a second epoch after the first epoch, the one or more low entropy address bits; and sending 206 the one or more second transaction layer packets 208.

The method of FIG. 5 differs from FIG. 4 in that the method of FIG. 5 also includes synchronizing 502 the first bitmask register 406 and the first bit array register 412 with a second bitmask register and a second bit array register of a recipient of the one or more second transaction layer packets 208. For example, a decompaction unit (e.g., a decompaction unit 114 of a device 102b) includes a second bitmask register and a second bit array register to facilitate regenerating memory addresses from the compacted memory addresses of the received second transaction layer packets 208. Accordingly, the compaction unit 200 sends a message or signal causing the values of the first bitmask register 406 and the first bit array register 412 to be stored in the second bitmask register and second bit array register, respectively.

Figure 6:
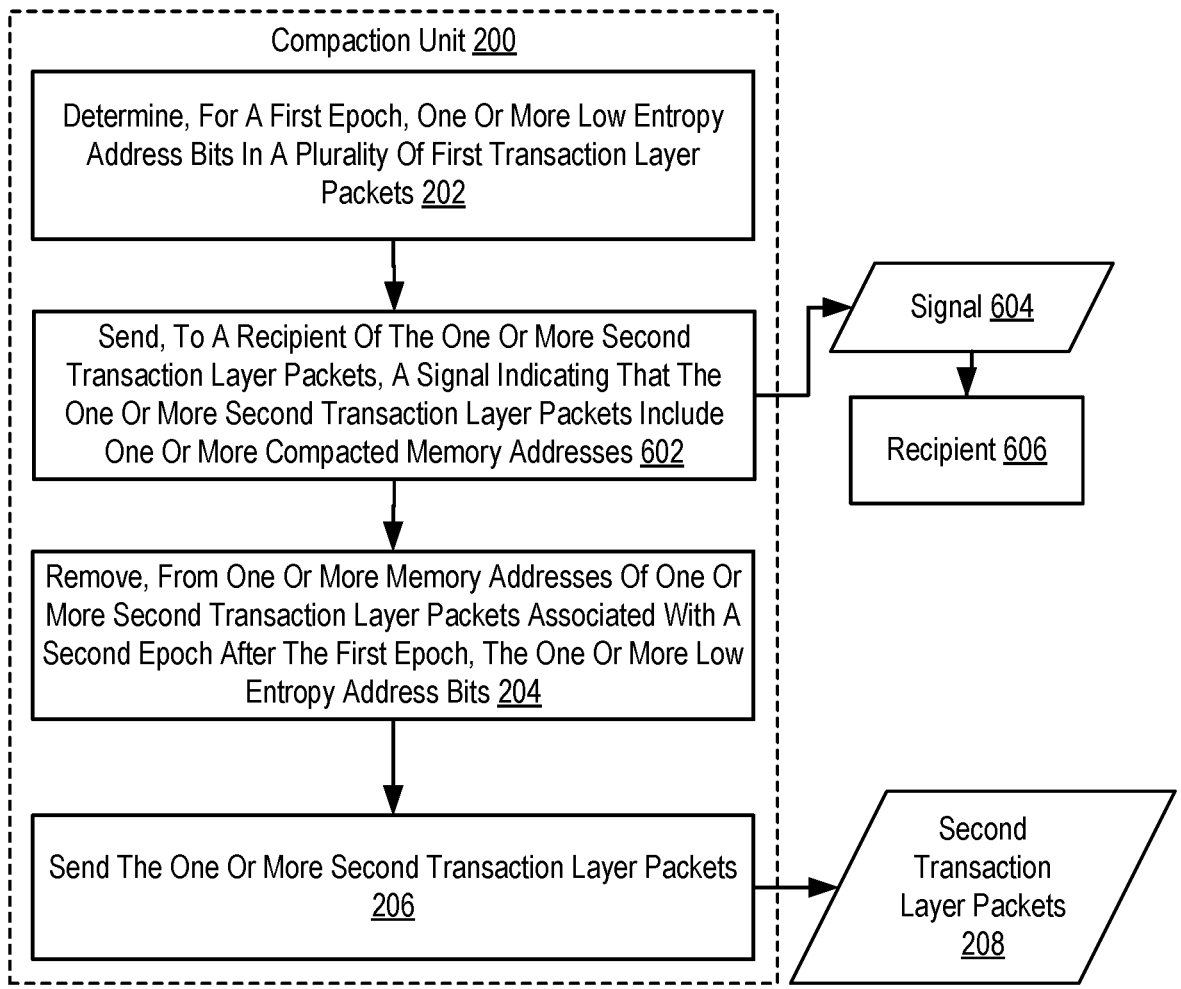
FIG. 6 is a flowchart of an example method for compacted addressing for transaction layer packets according to some embodiments.

For further explanation, FIG. 6 sets forth a flow chart illustrating an exemplary method for compacted addressing for transaction layer packets that includes determining 202 (e.g., by a compaction unit 200), for a first epoch, one or more low entropy address bits in a plurality of first transaction layer packets; removing 204, from one or more memory addresses of one or more second transaction layer packets 208 associated with a second epoch after the first epoch, the one or more low entropy address bits; and sending 206 the one or more second transaction layer packets 208.

The method of FIG. 6 differs from FIG. 2 in that the method of FIG. 6 also includes sending 602, to a recipient 606 of the one or more second transaction layer packets, a signal 604 indicating that the one or more second transaction layer packets 208 include one or more compacted memory addresses. For example, in some embodiments, sending 602 the signal 604 includes asserting a signal on a bus or other signal path from the compaction unit 202 to the recipient 606 device. In other embodiments, sending 602 the signal includes sending a message indicating that the second transaction layer packets 208 will include compacted memory addresses. Thus, the recipient 606 devices know to regenerate the original memory addresses of the second transaction layer packets 208 from compacted memory addresses.

Figure 7:
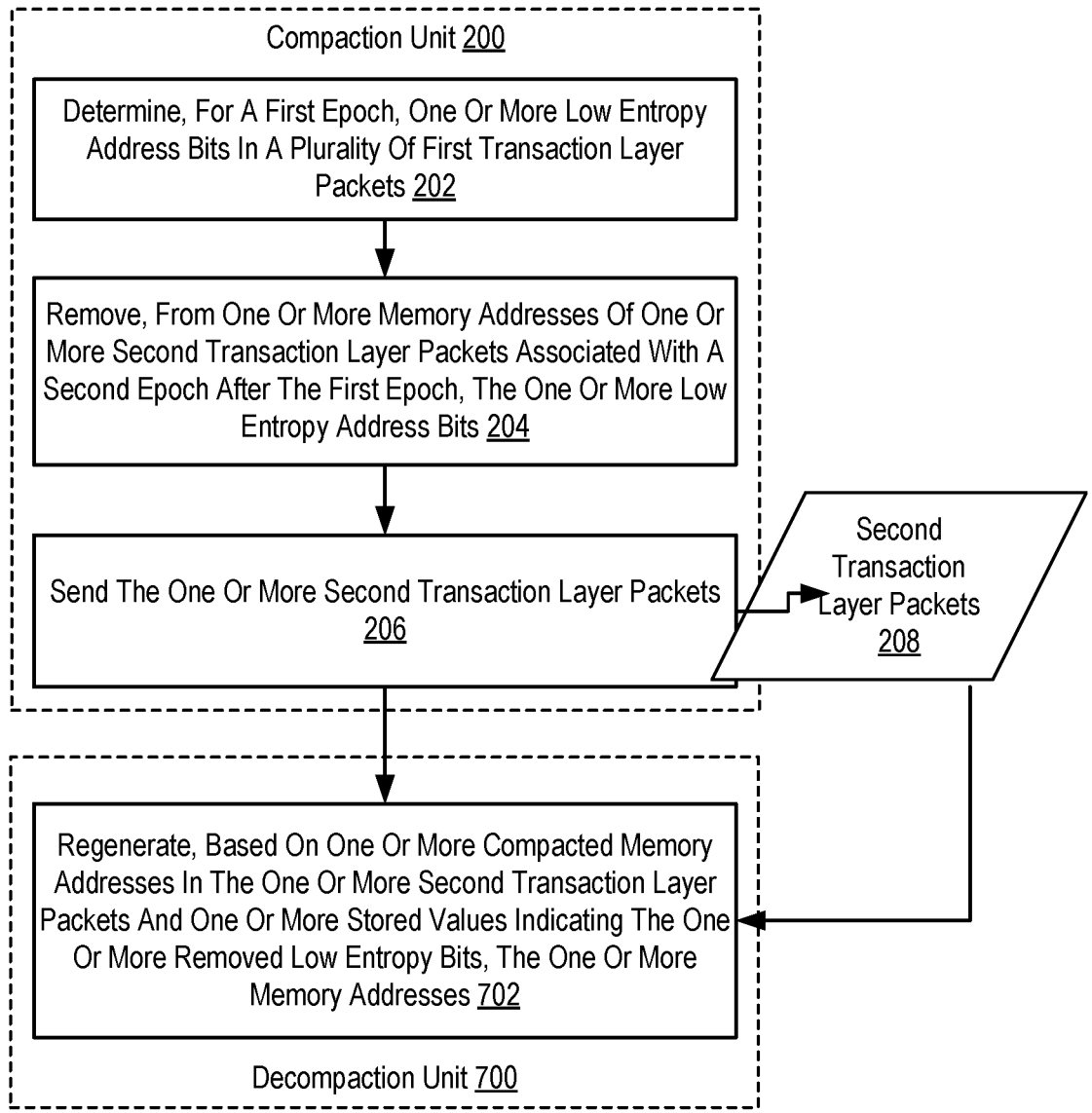
FIG. 7 is a flowchart of an example method for compacted addressing for transaction layer packets according to some embodiments.

For further explanation, FIG. 7 sets forth a flow chart illustrating an exemplary method for compacted addressing for transaction layer packets that includes determining 202 (e.g., by a compaction unit 200), for a first epoch, one or more low entropy address bits in a plurality of first transaction layer packets; removing 204, from one or more memory addresses of one or more second transaction layer packets 208 associated with a second epoch after the first epoch, the one or more low entropy address bits; and sending 206 the one or more second transaction layer packets 208.

The method of FIG. 7 differs from FIG. 2 in that the method of FIG. 7 also includes regenerating 702 (e.g., by a decompaction unit 702), based on one or more compacted memory addresses in the one or more second transaction layer packets 208 and one or more stored values indicating the one or more removed low entropy bits, the one or more memory addresses. In some embodiments, the one or more stored values include a bitmask stored in a bitmask register and a bit array stored in a bit array register. For example, the bitmask register and bit array register of the decompaction unit 700 are synchronized with another bitmask register and bit array register of the compaction unit 200. In some embodiments, regenerating 702 the one or more memory addresses is performed in response to a signal from the compaction unit 200 indicating that the second transaction layer packets 208 include compacted memory addresses.

In view of the explanations set forth above, readers will recognize that the benefits of compacted addressing for transaction layer packets include:
- Improved performance of a computing system by reducing the size required to express a memory address in a transaction layer packet.
- Improved performance of a computing system by allowing for memory address bits reclaimed through memory address compaction to be used for other values, such as error correction codes, thereby improving signal integrity without increasing packet size or transportation overhead.
- Improved performance of a computing system by reducing packet transmission resource requirements due to reducing the overall size required to express the memory addresses.

Exemplary embodiments of the present disclosure are described largely in the context of a fully functional computer system for compacted addressing for transaction layer packets. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method of compacted addressing for transaction layer packets, the method comprising:
   receiving, for a first epoch, a plurality of first transaction layer packets including a plurality of address bits;
   maintaining, for each address bit in the plurality of first transaction layer packets, a corresponding counter, the corresponding counter indicating whether the address bit is a low entropy address bit;
   removing, from one or more memory addresses of one or more second transaction layer packets associated with a second epoch after the first epoch, one or more low entropy address bits; and
   sending the one or more second transaction layer packets.

2. The method of claim 1, further comprising:
   modifying, the corresponding counter based on a bit value for each address bit in the plurality of first transaction layer packets; and
   determining, based on the corresponding counter for each address bit in the plurality of first transaction layer packets, the one or more low entropy address bits.

3. The method of claim 1, further comprising:
   storing, in a first bitmask register, a bitmask indicating the one or more low entropy address bits; and
   storing, in a first bit array register, one or more predicted values for the one or more low entropy bits.

4. The method of claim 3, further comprising synchronizing the first bitmask register and the first bit array register with a second bitmask register and a second bit array register of a recipient of the one or more second transaction layer packets.

5. The method of claim 1, further comprising regenerating, based on one or more compacted memory addresses in the one or more second transaction layer packets and one or more stored values indicating the one or more removed low entropy bits, the one or more memory addresses.

6. The method of claim 5, wherein the one or more stored values comprise a second bitmask register storing a bitmask indicating the one or more low entropy bits and a second bit array register storing one or more values for the one or more low entropy bits.

7. The method of claim 1, further comprising sending, to a recipient of the one or more second transaction layer packets, a signal indicating that the one or more second transaction layer packets include one or more compacted memory addresses.

8. An apparatus for compacted addressing for transaction layer packets, the apparatus comprising:
   a processor and non-transitory memory, the non-transitory memory storing instructions when executed by the processor to:
   receive, for a first epoch, a plurality of first transaction layer packets including a plurality of address bits;
   maintain, for each address bit in the plurality of first transaction layer packets, a corresponding counter, the corresponding counter indicating whether the address bit is a low entropy address bit;
   remove, from one or more memory addresses of one or more second transaction layer packets associated with a second epoch after the first epoch, the one or more low entropy address bits; and
   send the one or more second transaction layer packets.

9. The apparatus of claim 8, the instructions further to:
   modifying, the corresponding counter based on a bit value for each address bit in the plurality of first transaction layer packets; and
   determining, based on the corresponding counter for each address bit in the plurality of first transaction layer packets, the one or more low entropy address bits.

10. The apparatus of claim 8, the instructions further to:
    store, in a first bitmask register, a bitmask indicating the one or more low entropy address bits; and
    store, in a first bit array register, one or more predicted values for the one or more low entropy bits.

11. The apparatus of claim 10, the instructions further to synchronize the first bitmask register and the first bit array register with a second bitmask register and a second bit array register of a recipient of the one or more second transaction layer packets.

12. The apparatus of claim 8, the instructions further to regenerate, based on one or more compacted memory addresses in the one or more second transaction layer packets and one or more stored values indicating the one or more removed low entropy bits, the one or more memory addresses.

13. The apparatus of claim 12, wherein the one or more stored values comprise a second bitmask register storing a bitmask indicating the one or more low entropy bits and a second bit array register storing one or more values for the one or more low entropy bits.

14. The apparatus of claim 8, wherein the instructions further to send, to a recipient of the one or more second transaction layer packets, a signal indicating that the one or more second transaction layer packets include one or more compacted memory addresses.

15. A system for compacted addressing for transaction layer packets, comprising:
    a compaction unit; and
    a decompaction unit in communication with the compaction unit;
    the compaction unit configured to:
    receive, for a first epoch, a plurality of first transaction layer packets;
    maintain, for each address bit in the plurality of first transaction layer packets, a corresponding counter, the corresponding counter indicating whether the address bit is a low entropy address bit;
    remove, from one or more memory addresses of one or more second transaction layer packets associated with a second epoch after the first epoch, the one or more low entropy address bits; and
    send the one or more second transaction layer packets to the decompaction unit.

16. The system of claim 15, wherein the compaction unit is further configured to:
- modifying, the corresponding counter based on a bit value for each address bit in the plurality of first transaction layer packets; and
- determining, based on the corresponding counter for each address bit in the plurality of first transaction layer packets, the one or more low entropy address bit.

17. The system of claim 15, wherein the compaction unit is further configured to:
- store, in a first bitmask register, a bitmask indicating the one or more low entropy address bits; and
- store, in a first bit array register, one or more predicted values for the one or more low entropy bits.

18. The system of claim 17, wherein the compaction unit is further configured to synchronize the first bitmask register and the first bit array register with a second bitmask register and a second bit array register of a recipient of the one or more second transaction layer packets.

19. The system of claim 15, wherein the decompaction unit is configured to regenerate, based on one or more compacted memory addresses in the one or more second transaction layer packets and one or more stored values indicating the one or more removed low entropy bits, the one or more memory addresses.

20. The system of claim 19, wherein the one or more stored values comprise a second bitmask register storing a bitmask indicating the one or more low entropy bits and a second bit array register storing one or more values for the one or more low entropy bits.

\* \* \* \* \*